US005742359A

United States Patent [19]

Han

[11] Patent Number: 5,742,359

[45] Date of Patent: Apr. 21, 1998

[54] ELECTRONIC APPLIANCE WITH CONSTRUCTION CAPABLE OF EASILY MAINTAINING DESIRED CONTACT SPACE BETWEEN ITS CONTROL KNOB AND SWITCH

[75] Inventor: Sang-hyun Han, Suwon, Rep. of Korea

[73] Assignee: Samsung Electronics Ltd., Suwon, Rep. of Korea

[21] Appl. No.: 697,313

[22] Filed: Aug. 22, 1996

[30] Foreign Application Priority Data

| | | | |
|---|---|---|---|
| Aug. 23, 1995 | [KR] | Rep. of Korea | 95-21922 |
| Aug. 23, 1995 | [KR] | Rep. of Korea | 95-21926 |
| Aug. 23, 1995 | [KR] | Rep. of Korea | 95-26206 |

[51] Int. Cl.[6] .......... H04N 5/64; H05K 5/00; A47B 81/00; H01H 9/02

[52] U.S. Cl. .......... 348/836; 348/787; 348/789; 361/752; 361/781; 200/296; 312/223.2

[58] Field of Search .......... 348/787, 789, 348/794, 836, 843; 200/295, 292, 296; 361/732, 752, 742, 758, 781; 455/347, 348, 550, 90; 312/223.1, 223.2, 263, 265.5, 7.1, 7.2; 345/905

[56] References Cited

U.S. PATENT DOCUMENTS

| | | | |
|---|---|---|---|
| 5,363,150 | 11/1994 | Kojima | 348/836 |
| 5,455,743 | 10/1995 | Miyajima | 361/781 |
| 5,575,545 | 11/1996 | Wang | 348/836 |

*Primary Examiner*—Edward L. Coles, Sr.
*Assistant Examiner*—Kimberly A. Williams
*Attorney, Agent, or Firm*—Banner & Witcoff, Ltd.

[57] ABSTRACT

An electronic appliance with a construction capable of maintaining a desired contact space between the control switch of its control circuit board coupled between first and second cases mating with each other and the control shaft of its control knob. A plurality of elastic members are provided at the second case to apply a resilience force generated therefrom to the control circuit board when they receive a force applied to the first case upon assembling the first case with the second case via the control circuit board, so that the control circuit board can move toward the first case in such a manner that an accurate contact space is maintained between the control knob fixedly mounted to the first case and the control switches of the control circuit board. Accordingly, an improvement in productivity and reliance is achieved.

7 Claims, 5 Drawing Sheets

ELECTRONIC APPLIANCE WITH CONSTRUCTION CAPABLE OF EASILY MAINTAINING DESIRED CONTACT SPACE BETWEEN ITS CONTROL KNOB AND SWITCH

BACKGROUND OF THE INVENTION

1. Field of the Invention

The present invention relates to an electronic appliance such as a display device, and more particularly to such an electronic appliance with a construction capable of easily and accurately maintaining a desired contact space between its control knob adapted to adjust a desired function and a switch associated with the control knob.

2. Description of the Prior Art

Generally, electronic appliances such as monitors include a control knob for adjusting a desired function to obtain, for example, an improvement in picture quality. Such a control knob is mounted to the case of an electronic appliance to which it is applied in such a manner that it can be depressed.

Since such control knobs are adapted to adjust desired functions, they typically have a compact size. Generally, most electronic appliances each have a plurality of control knobs because they have various functions.

To this end, control knobs for one electronic appliance are integrally made in the form of a mold. Typically, such a mold has a thin slip construction.

By such a construction, control knobs can be easily depressed or pushed by a relatively slight push force of a user's finger. When a control knob is depressed, it presses a switch associated therewith, thereby achieving a desired function adjustment. In other words, such control knobs are used as control adjustment means for electronic appliances.

FIGS. 1 and 2 illustrate such control adjustment means having a conventional construction applied to a monitor, respectively.

As shown in the drawings, the monitor includes a control circuit board 1 for controlling various functions of the monitor. A plurality of control switches 2 are mounted on the control circuit board 1 in such a manner that they can be depressed by a control knob 6.

To this end, each control switch 2 has a contact shaft 2*a* so that it can operate when the contact shaft 2*a* is depressed. In a control switch having such a construction, a contact switch is typically used.

The control knob 6 has a plurality of horizontally aligned control shafts 6*a* each adapted to depress the contact shaft 2*a* of each control switch 2 associated therewith. In front of each control shaft 6*a*, the control knob 6 is provided with a forward extending-touch shaft 6*b* which is adapted to push the control shaft 6*a* against the corresponding contact shaft 2*a* when it is pushed rearward by a user's finger.

In order to fixedly mount the control knob 6 to a case 7 of the monitor, fixing members 6*c* are provided at its upper portion. The fixing members 6*c* of the control knob 6 are coupled to knob fixing portions 8 provided at the inner surface of the case 7 by means of screws 5', respectively.

In the above construction, when a selected touch shaft 6*b* of the control knob 6 is depressed, the associated control shaft 6*a* is pushed rearward. On the other hand, the rearwardly pushed control shaft 6*a* returns to its original position by virtue of its elasticity when the depressing force is removed from the associated touch shaft 6*b*.

The control circuit board 1 is fixedly mounted to a fixing boss 4 provided at another case 3 which mates with the case 7, by means of screws 5. When the control circuit board 1 is mounted to the fixing boss 4, it is important to align the contact shaft 2*a* of each control switch 2 with the associated control shaft 6*a* of the control knob 6. In this case, it is also important to maintain a very small contact space S, hardly visible to the naked eye, between the contact shaft 2*a* of the control switch 2 and the associated control shaft 6*a* of the control knob 6.

Practically, the contact space S ranges from about 0.2 mm to about 0.25 mm in the case of display devices. The reason why such a contact space S is necessary will be described hereinafter.

If the contact shaft 2*a* of the control switch 2 and the associated control shaft 6*a* of the control knob 6 are designed in such a manner that no contact space is defined therebetween, namely, that they are in contact with each other, they may be assembled in a state that the contact shaft 2*a* is depressed by the control shaft 6*a* due to manufacturing and assembling tolerances.

Such an assembled condition in that the control shaft continuously depresses the associated contact shaft results in production of a poor quality product. In order to eliminate such a factor resulting in poor quality products, it is required to manufacture products with an accuracy involving no manufacturing and assembling tolerance. However, this is impractical.

Typically, control knobs used in electronic appliances are small in size so that they can be depressed by a user's finger. They are also constructed to have a very short distance by which they move while being depressed.

Where a control knob is designed to have a contact space considerably longer than the above-mentioned contact space S ranging from about 0.2 mm to about 0.25 mm, its control shaft may not push or may insufficiently push the contact shaft of the associated control switch even when the control knob is depressed. In this case, a desired control function is not achieved.

For this reason, in the case of FIGS. 1 and 2, the control knob is designed to define a very small contact space S, hardly visible to the naked eye, between the contact shaft of each control switch and the associated control shaft.

In this case, however, there is a problem in that it is difficult to maintain a desired contact space between the contact shaft 2*a* of the control switch 2 and the associated control shaft 6*a* of the control knob 6 due to manufacturing and assembling tolerances.

For example, where the case 7 is assembled with the case 3 in a state that it is disposed at a position shifted from a desired assembling position inwardly, namely, toward the case 3, the control shaft 6*a* may be assembled in such a state that it depresses the contact shaft 2*a* of the associated control switch 2 even though the shifted length of the case 7 is small. This is because the control circuit board 1 is in a fixed state.

On the other hand, where the case 7 is assembled with the case 3 in a state that it is disposed at a position outwardly shifted from a desired assembling position, the control shaft 6*a* may be assembled in such a state that it can not depress the contact shaft 2*a* of the associated control switch 2 when the control knob is pushed. This is because the contact space between the control shaft 6*a* and contact shaft 2*a* is considerably larger than a desired contact space S. In this case, it is difficult to normally operate the control switch.

Thus, when a desired contact space S is not maintained due to the above-mentioned assembling error, an erroneous function adjustment for the electronic appliance occurs because the control shaft 6a abnormally actuates the contact shaft 2a even though the touch shaft 6b is normally depressed or because the control shaft 6a is in such a state that it always depresses the contact shaft 2a.

To this end, it is required to check the contact space in the assembling process. Furthermore, a difficulty in assembling is involved in maintaining a desired contact space. Where an erroneous assembling occurs, there is a degradation in efficiency of the assembling process and productivity due to requirement of a re-assembling. A degradation in reliance also occurs.

In the above-mentioned conventional construction, the control knob 6 is fixedly mounted to the case 7 by coupling its fixing members 6c to the knob fixing portions 8 of the case 7 by means of screws 5' (FIG. 2). However, the mounting of the control knob 6 is achieved only at two end positions respectively corresponding to the positions of the fixing members 6c. As a result, there is a problem in that when an intermediate one of the touch shafts 6b is depressed, other touch shafts positioned adjacent to the intermediate touch shaft may also be depressed, thereby generating an erroneous operation.

SUMMARY OF THE INVENTION

Therefore, an object of the invention is to provide an electronic appliance with a construction capable of accurately maintaining a desired contact space between each control shaft of its control knob adapted to adjust a desired function and the contact shaft of a switch associated with the control knob.

Another object of the invention is to provide an electronic appliance with a construction capable of fixedly mounting its control circuit board mounted with a control knob along with control switches to its case without any fixing members such as screws, thereby achieving a reduction in the number of assembling process steps and a simpleness and convenience in the assembling process.

In accordance with the present invention, this object is accomplished by providing an electronic appliance comprising a first case, a second case mating with the first case, a control circuit board coupled between the first and second cases and provided with a plurality of control switches, and a control knob fixedly mounted to the first case and adapted to actuate the control switches, further comprising: control circuit board supporting means adapted to support the control circuit board, the control circuit board supporting means having support grooves respectively formed at the first and second cases and adapted to receive front and rear end portions of the control circuit board when the first and second cases are assembled with each other; and control circuit board urging means adapted to urge the control circuit board toward the first case, the control circuit board urging means having a plurality of elastic members provided at the second case and adapted to apply a resilience force generated therefrom to the control circuit board when they receive a force applied to the first case upon assembling the first case with the second case via the control circuit board, so that the control circuit board can move toward the first case in such a manner that an accurate contact space is maintained between the control knob fixedly mounted to the first case and the control switches of the control circuit board.

In accordance with a preferred embodiment of the invention, the mounting of the control knob to the first case is carried out by mounting means comprising a plurality of coupling holes provided at the control knob and a plurality of coupling protrusions provided at the first case and tight-fitted in the coupling holes, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Now, the present invention will be described in detail in conjunction with an embodiment applied to a monitor.

FIGS. 3 to 8 illustrate an embodiment of the present invention which is applied to a monitor, respectively. The monitor includes a front case shown as a first case 70 and a bottom case shown as a second case 30. Although not shown, the second case 30 may be a rear case in other display devices.

Figure 3:
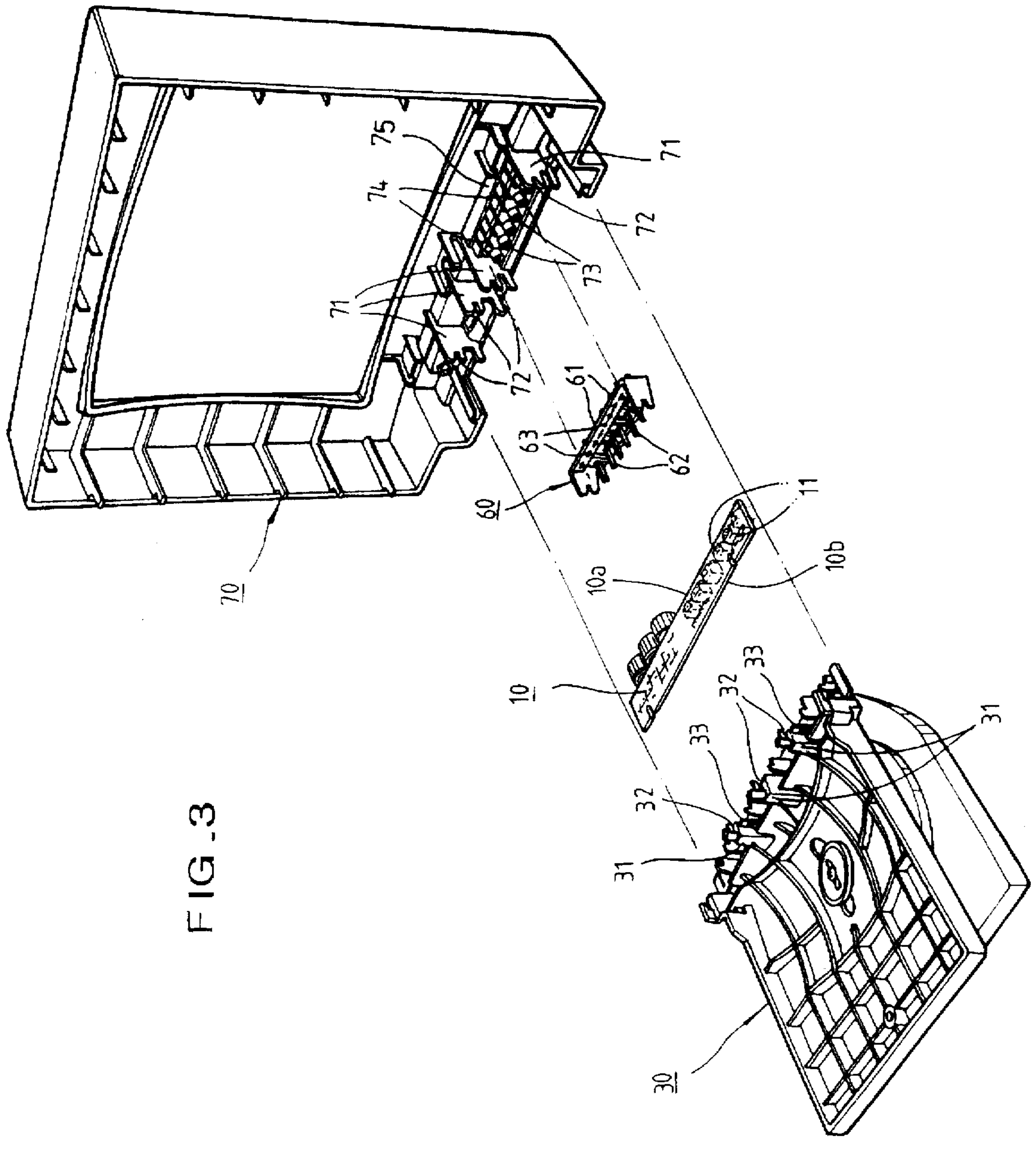
FIG. 3 is an exploded perspective view illustrating an arrangement according to the present invention.
Figure 4:
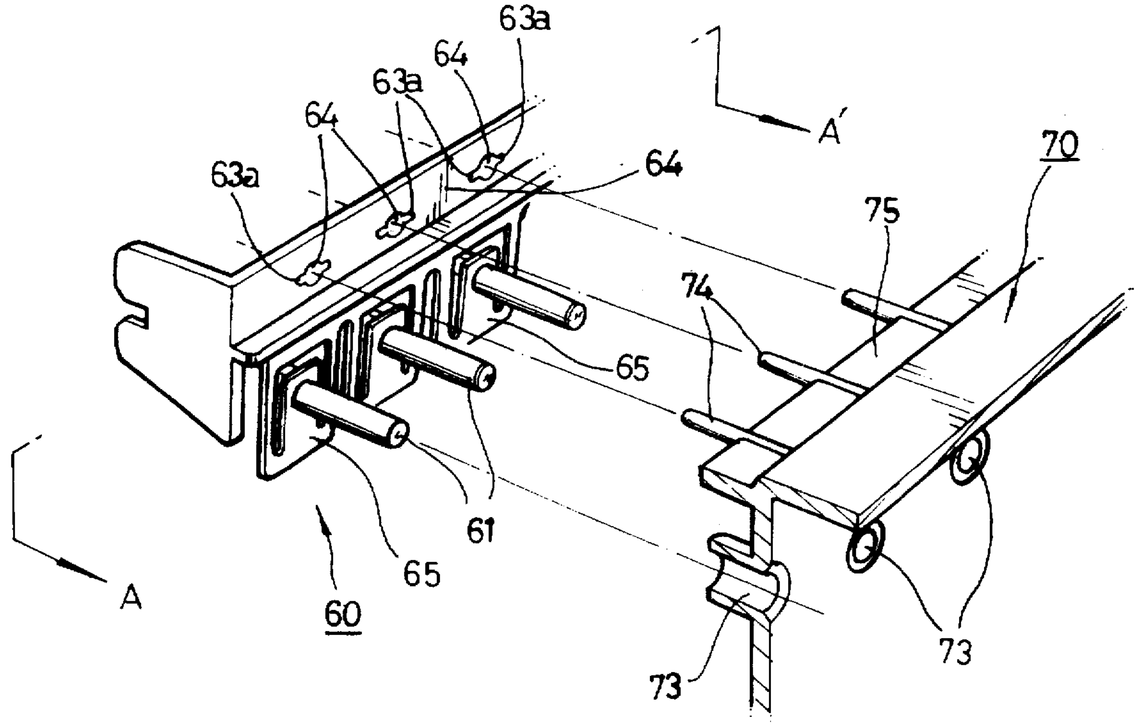
FIG. 4 is an exploded perspective view illustrating a control knob and cases included in the arrangement of FIG. 3.
Figure 5:
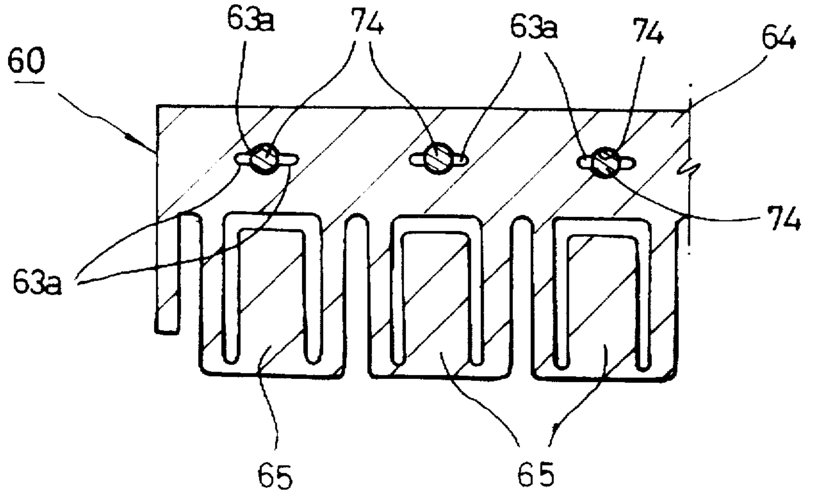
FIG. 5 is a cross-sectional view taken along the line A—A' of FIG. 4 in an assembled state.

As shown in FIGS. 3 and 4, a plurality of laterally spaced support ribs 71 are provided at the inner surface of the first case 70. Each support rib 71 has support grooves 72. The first case 70 also has a plurality of laterally aligned knob holes 73 disposed between desired adjacent ones of the support ribs 71.

Above the knob holes 73, a laterally elongated fixing member 75, extends rearward from the inner surface of the first case 70. The fixing member 75 has a plurality of uniformly spaced coupling protrusions 74 extending rearward from the rear end of the fixing member 75. The fixing member 75 serves to fixedly mount a control knob 60 thereto.

The control knob 60, which has a slip shape, is provided with a fixing portion 64 at its upper portion and a plurality of tension portions 65 integrated with the fixing portion 64. The tension portions 65 extend downward from the fixing portion 64. The control knob 60 also has a plurality of touch shafts 61 extending forward from respective front surfaces of the tension portions 65 and a plurality of control shafts 62 extending rearward from respective rear surfaces of the tension portions 65.

A plurality of laterally aligned coupling holes 63 are provided at the fixing portion 64 of the control knob 60. The coupling holes 63 forcibly receive the coupling protrusions 74 of the fixing member 75, respectively. In order to forcibly enlarge each coupling hole 63, a pair of slits 63*a* are provided at both sides of the coupling hole 63, respectively.

By this construction, the control knob 60 is coupled to the first case 70 in such a manner that the coupling protrusions 74 of the first case 70 are forcibly tight-fitted in the coupling holes 63 of the control knob 60, respectively. Such a tight fitting is achieved by making each coupling protrusion 74 have a diameter slightly larger than that of each coupling hole 63 by a length of, for example, about 0.3 to 0.4 mm. When each coupling protrusion 74 is inserted into each corresponding coupling hole 63, it forcibly enlarges the coupling hole 63, thereby achieving the above-mentioned tight fitting.

The enlargement of each coupling hole 63 is obtained by virtue of the slits 63*a* provided at both sides of the coupling hole 63. Accordingly, each coupling protrusion 74 is in a state that it is tight-fitted in the corresponding, forcibly enlarged coupling hole 63. As a result, each coupling protrusion 74 is coupled to the corresponding coupling hole 63 in a tightened state by the fixing portion 64 around the coupling hole 63.

Since the forcible coupling between the coupling holes 63 and coupling protrusions 74 is obtained at several places (6 to 9 places), the control knob 60 is assembled by a considerable coupling force. Accordingly, the control knob 60 is not separated from the first case 70 even when a selected one of the touch shafts 61 is depressed for a function adjustment.

Figure 1:
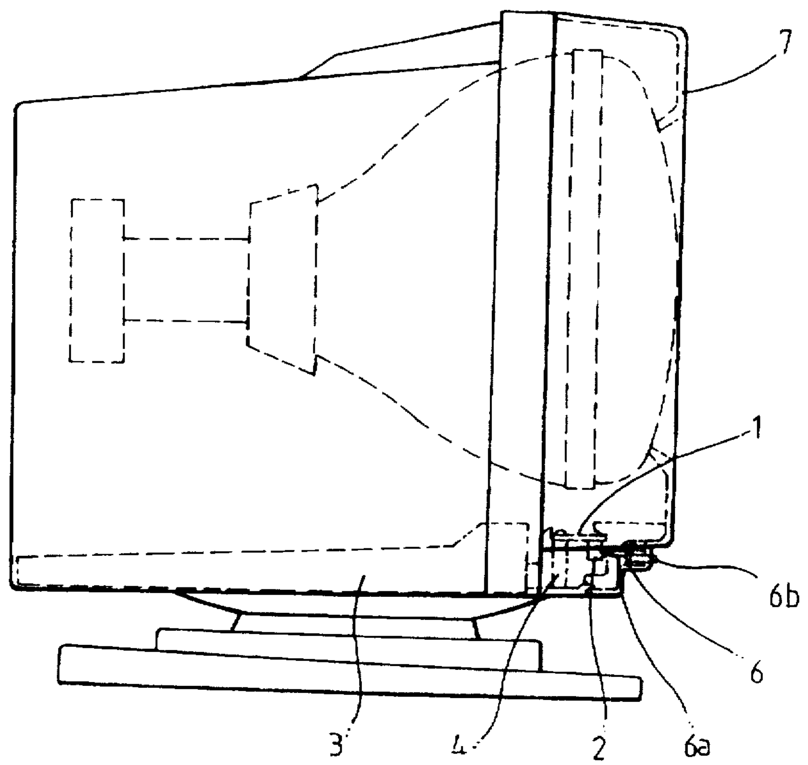
FIG. 1 PRIOR ART
FIG. 1 is a side view illustrating a monitor having control adjustment means with a conventional construction.
Figure 2:
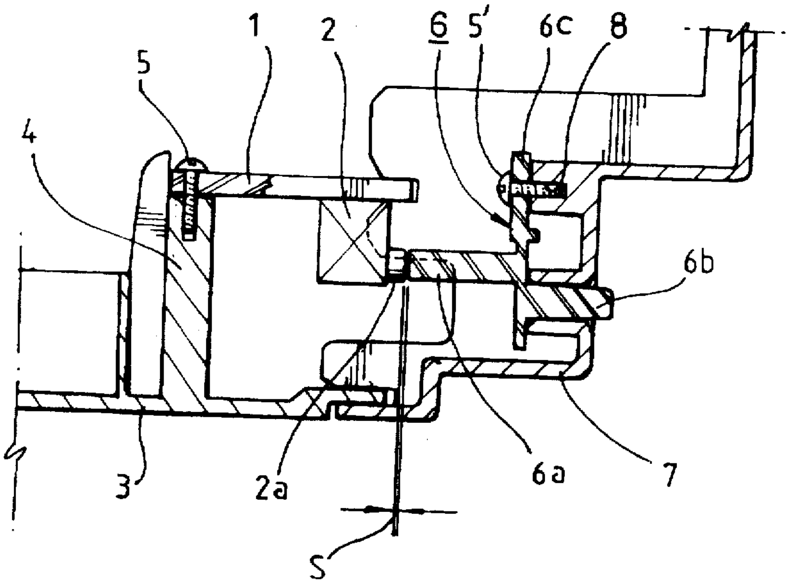
FIG. 2 PRIOR ART
FIG. 2 is an enlarged sectional view illustrating a portion of the conventional control adjustment means shown in FIG. 2.

In the conventional case shown in FIG. 2, the coupling of the control knob to the case is achieved only at two end positions of the control knob. As a result, there is a problem in that when an intermediate one of the touch shafts is depressed, other touch shafts positioned adjacent to the intermediate touch shaft may also be depressed, thereby generating an erroneous operation. However, such a phenomenon does not occur in the construction according to the present invention because the coupling between the coupling holes 63 and coupling protrusions 74 is obtained in a tightly fitted fashion at several places including the intermediate portion of the control knob.

FIG. 3 also shows a control circuit board 10 which has a plate shape. On the control circuit board 10, a plurality of control switches 11 are mounted in such a manner that they are laterally aligned with one another. Each control switch 11 has a contact shaft 12 (FIG. 6A) adapted to actuate the control switch 11 when it is pushed by an associated one of the control shafts 62 provided at the control knob 60.

On the other hand, the second case 30 is provided at its front end with a plurality of laterally uniformly spaced support bosses 31. Above the support bosses 31, a laterally extending support groove 32 is defined. In order to define the support groove 32, a plurality of forward-extending separation preventing ribs 35 are provided at the front end of the second case 30 above the support bosses 31.

The second case 30 is also provided with a plurality of upright elastic members 33 each disposed at one side of each support boss 31. The elastic members 33 are integrated with the second case 30.

Each elastic member 33 has an upper end portion 33*a* (FIG. 7) which protrudes upward in a manner such that it is substantially flushed with the support groove 32. In particular, the elastic members 33 are formed of the same material as the second case 30 to form an integral mold. By such a construction, the elastic members 33 are bent at their upper end portions when an external force is applied thereto. At this time, the elastic members 33 have an elastic force against the external force applied thereto so that they can return to their original state, namely, the upright state.

Figure 6A:
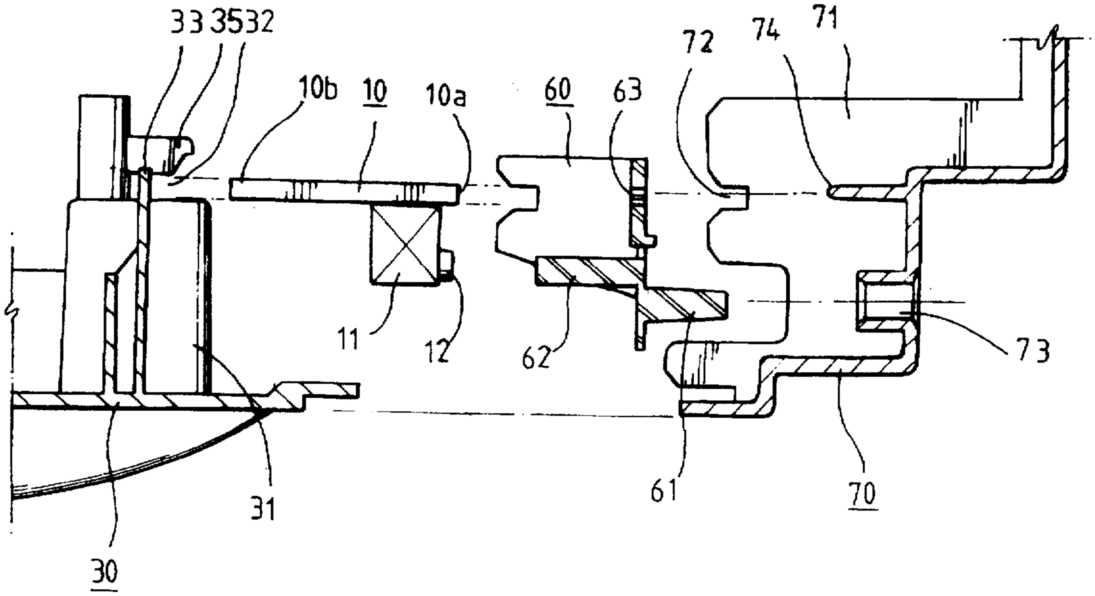
FIG. 6A is an exploded sectional view illustrating a portion of the arrangement according to the present invention.
Figure 6B:
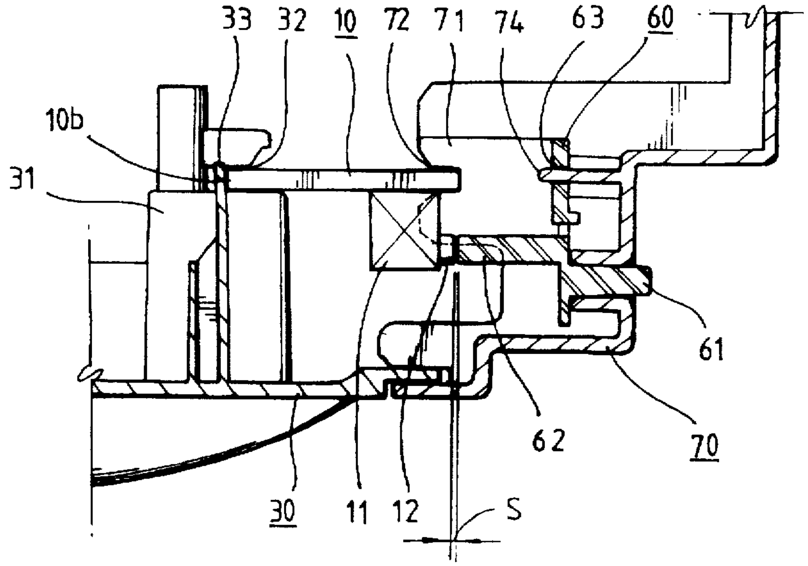
FIG. 6B is an assembled sectional view corresponding to FIG. 6A.
Figure 7:
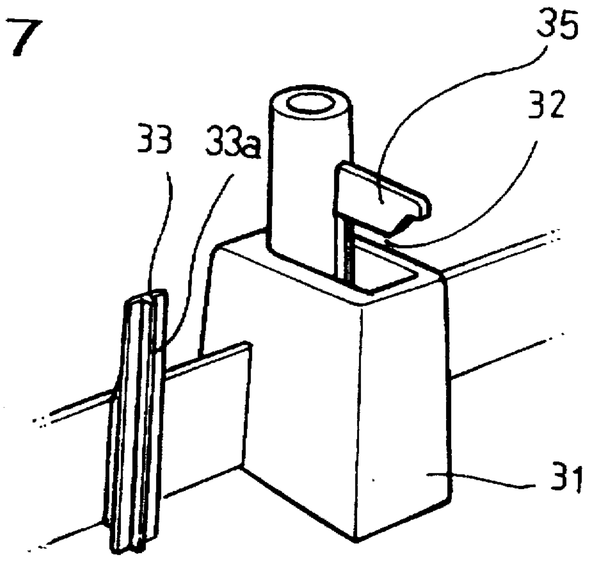
FIG. 7 is an exploded perspective view illustrating a portion of the arrangement according to the present invention.

The procedures of assembling the first and second cases 70 and 30, coupling the control circuit board 10 between the first and second cases 70 and 30, coupling the control circuit board 10 to the first case 70 and coupling the control knob 60 to the first case 70 will be described in conjunction with FIGS. 6A and 6B.

In a primary assembling procedure, the control knob 60 is coupled to the first case 70 in such a manner that it is disposed in the interior of the first case 70. The coupling of the control knob 60 is achieved by forcibly fitting the coupling protrusions 74 provided at the first case 70 in the coupling holes 63 of the control knob 60, respectively. Since the forcible coupling of the control knob 60 has been described hereinbefore, its detailed description will be omitted.

When the control knob 60 is coupled to the first case 70, it is pushed toward the first case 70 until it comes into dose contact with the knob fixing member 75 of the first case 70. In this case, it is unnecessary to use a relatively high force upon pushing the control knob 60 toward the first case 70. This is because slits 63*a* are provided at both sides of each coupling hole 63 in which each associated coupling protrusion 74 is forcibly fitted.

After completing the above-mentioned primary assembling procedure, the touch shafts 61 extend through the knob holes 73 of the first case 70 so that they protrude slightly from the knob holes 73, respectively. Accordingly, it is possible to push the touch shafts 61 outside of the first case 70. When a selected one of the touch shafts 61 is pushed, the tension portion 65 of the control knob 60 associated with the pushed touch shaft 61 is inwardly bent. As a result, the control shaft 62 integral with the inward-bent tension portion 65 moves rearward. When the pushing force applied to the touch shaft 61 is removed, the tension portion 65 returns to its original state, namely, its upright state by virtue of its elasticity. Accordingly, the control knob 60 returns to its original state.

In a secondary assembling procedure, the second case 30 is coupled to the first case 70 to which the control knob 60 has been coupled.

In the procedure of coupling the second case 30 to the first case 70, the control circuit board 10 is also coupled between the first and second cases 70 and 30. That is, the circuit board 10, which has control switches 11 corresponding in number to the touch shafts 61 of the control knob 60, is coupled between the first and second cases 70 and 30 by fitting its rear end portion 10*b* in the support groove 32 of the second case 30, and then fitting its front end portion 10*a* in the support grooves 72 of the support ribs 71 while coupling the second case 30 to the first case 70.

Figure 8:
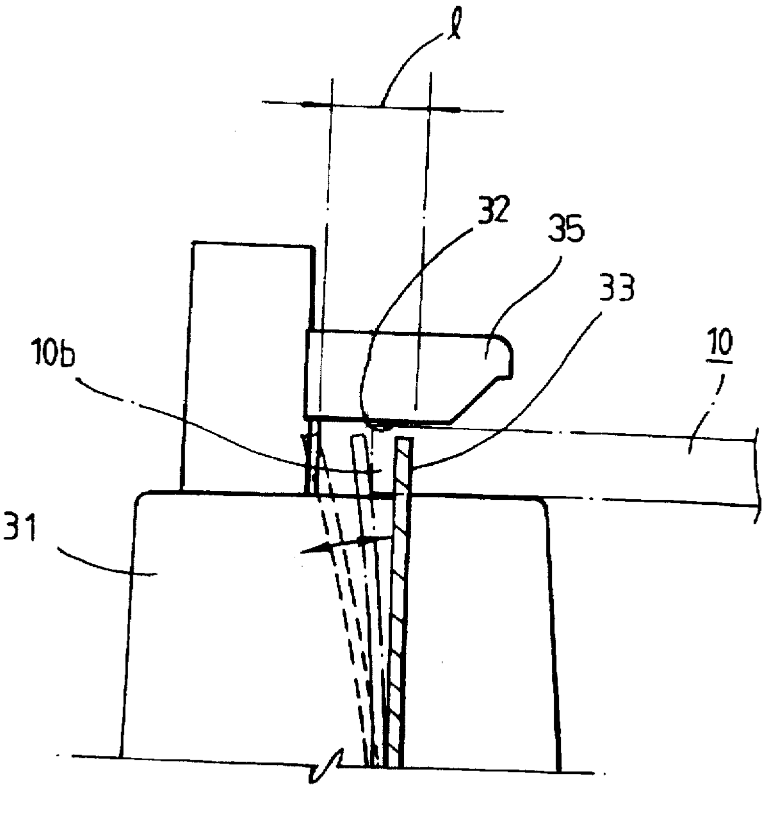
FIG. 8 is a side view illustrating the operation of an elastic member shown in FIG. 7.

When the first case 70 is pushed toward the second case 30 for their coupling, the rear end portion 10*b* of the control circuit board 10 pushes the elastic members 33, thereby causing the elastic members 33 to be rearward bent as shown in FIG. 8. FIG. 6B also shows the bent state of the elastic members 33.

In FIG. 8, the solid line shows the upright state of each elastic member 33 before the first case 70 is assembled with the second case 30 whereas the phantom line shows the maximum bent state of the elastic member 33. That is, the elastic members 33 have a maximum bending length L defined between their upright state and maximum bent state. When the first and second cases 70 and 30 are assembled with each other as designed, the control circuit board 10 is pushed rearward, thereby pushing the elastic members 33. As a result, the elastic members 33 are bent. In this connection, the elements 10, 30, 60 and 70 are designed in such a manner that the elastic members 33 bent by the control circuit board 10 are in an intermediate bent state between the upright state and maximum bent state. The intermediate bent state of the elastic members 33 is shown by the dotted line in FIG. 8.

Accordingly, in either the case wherein the first case 70 is assembled with the second case 30 so that it is disposed at a position shifted from its normal assembling position toward the second case 30 or the case wherein the first case 70 is assembled with the second case 30 so that it is disposed at a position shifted from its normal assembling position away from the second case, the length of the rear end portion 10*b* of the control circuit board 10 shifted toward the second case 30 by the assembling force of the first case 70 is within the maximum bending length L of the elastic members 33.

By such a construction, the control circuit board 10 is assembled in a manner such that its rear end portion 10*b* is disposed at a position slightly forward or rearward shifted from its normal position corresponding to an intermediate point of the maximum bending length L of the elastic members 33 when the first case 70 is assembled in such a state that it is slightly shifted from its normal assembling position toward or away from the second case 30.

In other words, when the assembled position of the first case 70 is shifted from a normal assembling position due to manufacturing and assembling tolerances, the control circuit board 10 is correspondingly shifted by the shifted length of the first case 70. By the shift of the control circuit board 10 corresponding to the shift of the first case 70, it is possible to achieve the assembly of the control circuit board 10 while keeping a desired contact space S between the contact shaft 12 of each control switch 11 and the associated control shaft 62 of the control knob 60 mounted to the first case 70.

Even when an erroneous assembling occurs between the first and second cases, that is, even when the first case is assembled in such a state that it is slightly shifted from its normal assembling position, the elastic members of the second case still urge the control circuit board toward the first case. Therefore, a desired contact space between the contact shaft of each control switch and the associated control shaft of the control knob fixedly mounted to the first case is always maintained in spite of an assembling error between the first and second cases resulting from manufacturing and assembling tolerances.

Thus, it is possible to easily maintain a desired contact space for control switches without any additional effort, thereby achieving a convenience in assembling process and an improvement in productivity.

Since a desired contact space for control switches is always maintained irrespective of the assembled state of cases, an erroneous operation of the control switches associated with the manipulation of the control knob does not occur. Accordingly, a great improvement in reliance is also achieved.

In accordance with the present invention, in particular, the control knob and control circuit board can be firmly mounted without using any additional fixing elements such as screws. Accordingly, it is possible to achieve a reduction in manufacturing cost as well as a reduction in the number of assembling process steps without interfering with the execution of desired functions.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electronic appliance comprising a first case, a second case mating with the first case, a control circuit board coupled between the first and second cases and provided with a plurality of control switches, and a control knob fixedly mounted to the first case and adapted to actuate the control switches, further comprising:

control circuit board supporting means adapted to support the control circuit board, the control circuit board supporting means having support grooves respectively formed at the first and second cases and adapted to receive front and rear end portions of the control circuit board when the first and second cases are assembled with each other; and control circuit board urging means adapted to urge the control circuit board toward the first case, the control circuit board urging means having a plurality of elastic members provided at the second case and adapted to apply a resilience force generated therefrom to the control circuit board when they receive a force applied to the first case upon assembling the first case with the second case via the control circuit board, so that the control circuit board can move toward the first case in such a manner that an accurate contact space is maintained between the control knob fixedly mounted to the first case and the control switches of the control circuit board.

2. The electronic appliance in accordance with claim 1, wherein the elastic members are constructed to be elastically bent upon receiving the assembling force from the first case, thereby moving the control circuit board in such a manner that the rear end portion of the control circuit board is shifted in the support groove of the second case from a reference position corresponding to an intermediate point of a maximum bending length of the elastic members toward or away from the first case.

3. The electronic appliance in accordance with claim 1, wherein the elastic members have upper end portions disposed in the support groove of the second case, respectively.

4. The electronic appliance in accordance with claim 1, wherein the mounting of the control knob to the first case is carried out by mounting means comprising a plurality of coupling holes provided at the control knob and a plurality of coupling protrusions provided at the first case and tight-fitted in the coupling holes, respectively.

5. The electronic appliance in accordance with claim 4, wherein the mounting means further comprises a pair of slits provided at both sides of each coupling hole adapted to enlarge the coupling hole when the associated coupling protrusion is forcibly fitted in the coupling hole, thereby obtaining a tight fitting between the coupling hole and protrusion.

6. The electronic appliance in accordance with claim 4, wherein the support groove of the first case is defined by a plurality of support ribs provided at the first case, and the support groove of the second case is defined by a plurality of support bosses provided at the second case.

7. The electronic appliance in accordance with claim 1, wherein the front end portion of the control circuit board is in close contact with an inner end of the support groove of the first case by the resilience force of the elastic members applied to the control circuit board.

* * * * *